US005909658A

United States Patent [19]
Clarke et al.

[11] Patent Number: 5,909,658
[45] Date of Patent: *Jun. 1, 1999

[54] HIGH SPEED ELECTRON BEAM LITHOGRAPHY PATTERN PROCESSING SYSTEM

[75] Inventors: Eileen Veronica Clarke, Fishkill; John William Kay, Lagrangeville; Christine Ann Kostek, Fishkill; Jon Erik Lieberman, Montgomery; Daniel Lee Pierce, Middletown; Robert Joseph Quickle; John Matthew Safran, both of Wappingers Falls, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/668,048

[22] Filed: Jun. 18, 1996

[51] Int. Cl.⁶ ..................................................... G06F 19/00
[52] U.S. Cl. ...................... 702/126; 702/40; 364/468.27; 364/468.28; 364/490; 250/492.2
[58] Field of Search .................................. 364/525, 514 A, 364/488–491, 468.27, 468.28, 470.02, 470.05, 470.06, 474.25; 395/141, 143, 501, 507, 508, 517, 441; 250/492.2, 492.3, 398, 442.11, 491.1, 492.22; 345/203, 133, 116, 190, 441, 418, 501, 519, 521, 526, 513, 197, 96 J; 437/928–931, 935–937; 382/243, 232–235, 144, 145, 152, 181, 217, 218; 341/51, 173, 174, 179, 180; 702/36, 38, 40, 80, 119, 123, 124, 126, 134, 155–157, 172, 179, 186, 189; 326/38, 39; 711/217, 170, 172, 109, 101, 1

[56] References Cited

U.S. PATENT DOCUMENTS

| | | | |
|---|---|---|---|
| 4,280,186 | 7/1981 | Hidai et al. ............................. | 395/141 |
| 4,387,433 | 6/1983 | Cardenia et al. ....................... | 364/491 |
| 4,435,779 | 3/1984 | Mayer et al. ........................... | 345/203 |
| 4,546,451 | 10/1985 | Bruce ..................................... | 395/512 |
| 4,698,509 | 10/1987 | Wells et al. ......................... | 250/492.2 |
| 4,718,019 | 1/1988 | Fillion et al. ........................... | 364/491 |
| 5,005,138 | 4/1991 | Tobuse et al. ...................... | 250/492.2 |
| 5,175,435 | 12/1992 | Sakamoto et al. .................. | 250/492.2 |
| 5,251,140 | 10/1993 | Chung et al. ........................... | 364/490 |
| 5,386,211 | 1/1995 | Goveas ..................................... | 341/51 |
| 5,404,019 | 4/1995 | Ohno et al. ........................ | 250/492.22 |
| 5,428,552 | 6/1995 | Rudert, Jr. et al. ..................... | 364/491 |
| 5,448,075 | 9/1995 | Fueki et al. ........................ | 250/492.22 |
| 5,481,472 | 1/1996 | Chung et al. ........................... | 364/490 |
| 5,537,567 | 7/1996 | Galbraith et al. ...................... | 395/441 |
| 5,691,541 | 11/1997 | Ceglio et al. ........................ | 250/492.1 |
| 5,745,734 | 4/1998 | Craft et al. ............................... | 326/39 |
| 5,768,372 | 6/1998 | Sung et al. ............................... | 326/38 |

OTHER PUBLICATIONS

Rockrohr et al., Performance of IBM's EL–4 e–beam lithography system, Reprinted from Electron–Beam,X–ray, EUV, and Ion–Beam Submicrometer Lithographies for Manufacturing V, Feb. 20–21, 1995, vol. 2437, pp. 160–167.

*Primary Examiner*—Hal Dodge Wachsman
*Attorney, Agent, or Firm*—Schmeiser, Olsen & Watts; Lawrence D. Cutter; Steven J. Soucar

[57] ABSTRACT

A pattern data processor system is disclosed that comprises a pattern storage device for storing pattern data, a Redundant Array of Independent Disks (RAID) pattern memory buffer for receiving and temporarily holding the pattern data from the pattern storage device, a shape processor for processing and decoding the pattern data, a shape divider, and a shape generator for generating a shape from the decoded pattern data. The shape processor comprises a programmable gate array device (FPGA) that dynamically decodes different pattern data formats with different decoding schemes, allowing for high speed processing. A Previous Output Shape (POS) Register is also disclosed, which uses information from previous shapes to decompress new shapes, thus allowing for variable length macro and pattern data, and conserving disk space.

18 Claims, 11 Drawing Sheets

HIGH SPEED ELECTRON BEAM LITHOGRAPHY PATTERN PROCESSING SYSTEM

BACKGROUND OF THE INVENTION

1. Technical Field

The invention relates generally to a data processing system for processing pattern data and, more specifically, to a processor system for storing and processing pattern data in a high speed electron beam lithography system.

2. Background Art

Advances in modern microelectronics allow placing an increasing number of devices on a single integrated circuit base. One method of forming devices on an integrated circuit base is through electron beam (E-beam) lithography. In E-beam lithography, devices are generated on the circuit base through patterns that are processed in the pattern processing system of the E-beam system. The data used to generated the patterns of the devices is called pattern data. The typical pattern processing system of an E-beam lithography system comprises a controller, pattern storage device, buffer device and processor. The buffer device temporarily holds the pattern data from the pattern storage device until it can be processed and decoded by the processor.

One example of a typical pattern processing system is U.S. Pat. No. 4,698,509 "High Speed Pattern Generation for Electron Beam Lithography," issued to Wells et al. Wells et al. disclose a system that uses a random access memory (RAM) buffer for temporarily storing the pattern data. Custom hardware is used to decode the pattern data format specifically used for Wells' disclosure. The decoded pattern data is then used to generate the desired shape. Some disadvantages to using the system of Wells et al. are as follows: first, RAM buffers are typically large and expensive and, for storing patterns, consume a relatively large amount of power; second, unless the custom hardware is removed and redesigned, only the specified pattern data format may be decoded, and even then the new redesigned hardware is only set up for the new data format; and third, since there is no data compression in the system of Wells et al., extra space is being used in storing repetitive patterns.

Other typical pattern processing systems are found in the following U.S. Patents: U.S. Pat. No. 4,718,019 "Electron Beam Exposure System and an Apparatus for Carrying Out a Pattern Unwinder," issued to Fillion et al.; U.S. Pat. No. 4,280,186, "Exposure Apparatus Using Electron Beams," issued to Hidai et al.; and U.S. Pat. No. 5,005,138, "Electron Beam Direct Printing Apparatus," issued to Tobuse et al. Although these patents disclose an apparatus and process for storing and decoding pattern data, they use RAM buffers, which, as aforementioned, are large and expensive. Furthermore, they use custom hardware and/or software that is not reconfigurable for different decode formats "on-the-fly" (i.e., the hardware/software needs to be removed, redesigned and reprogrammed before another decode format may be used). Finally, the pattern data/elements are not compressed, thus wasting extra space.

Accordingly, a need has developed in the art for a pattern data processor that will efficiently and inexpensively store and process control pattern data.

SUMMARY OF THE INVENTION

It is thus an advantage of the present invention to provide a pattern processing system that stores pattern data in an inexpensive and space saving disk drive.

It is a further advantage of the present invention to provide a pattern processing system that is able to dynamically change decompression schemes among differing formats.

It is yet a further advantage of the present invention to provide a pattern processing system that will use information from previous shapes to decompress new shapes, thus saving memory space.

The foregoing and other advantages of the invention are realized by a pattern processor system that comprises a pattern storage device for storing pattern data, and a Redundant Array of Independent Disks (RAID) pattern buffer, which is coupled to the pattern storage device, for receiving and temporarily holding the pattern data from the pattern storage device. The pattern processing system further comprises a shape processor, which is coupled to the RAID buffer, for processing and decoding the pattern data, and a shape generator, coupled to the shape processor, for generating a shape from the decoded pattern data.

The shape processor comprises a field programmable gate array device (FPGA) that dynamically decodes different pattern data formats with different decoding schemes, allowing for high speed processing.

One other feature of the invention is the use of a Previous Output Shape (POS) Register, which stores information from previous shapes for the decompressing of new shapes. This feature allows only the variations between the elements of pattern data to be stored, thus compressing the data and conserving disk space.

The foregoing and other objects, features and advantages of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
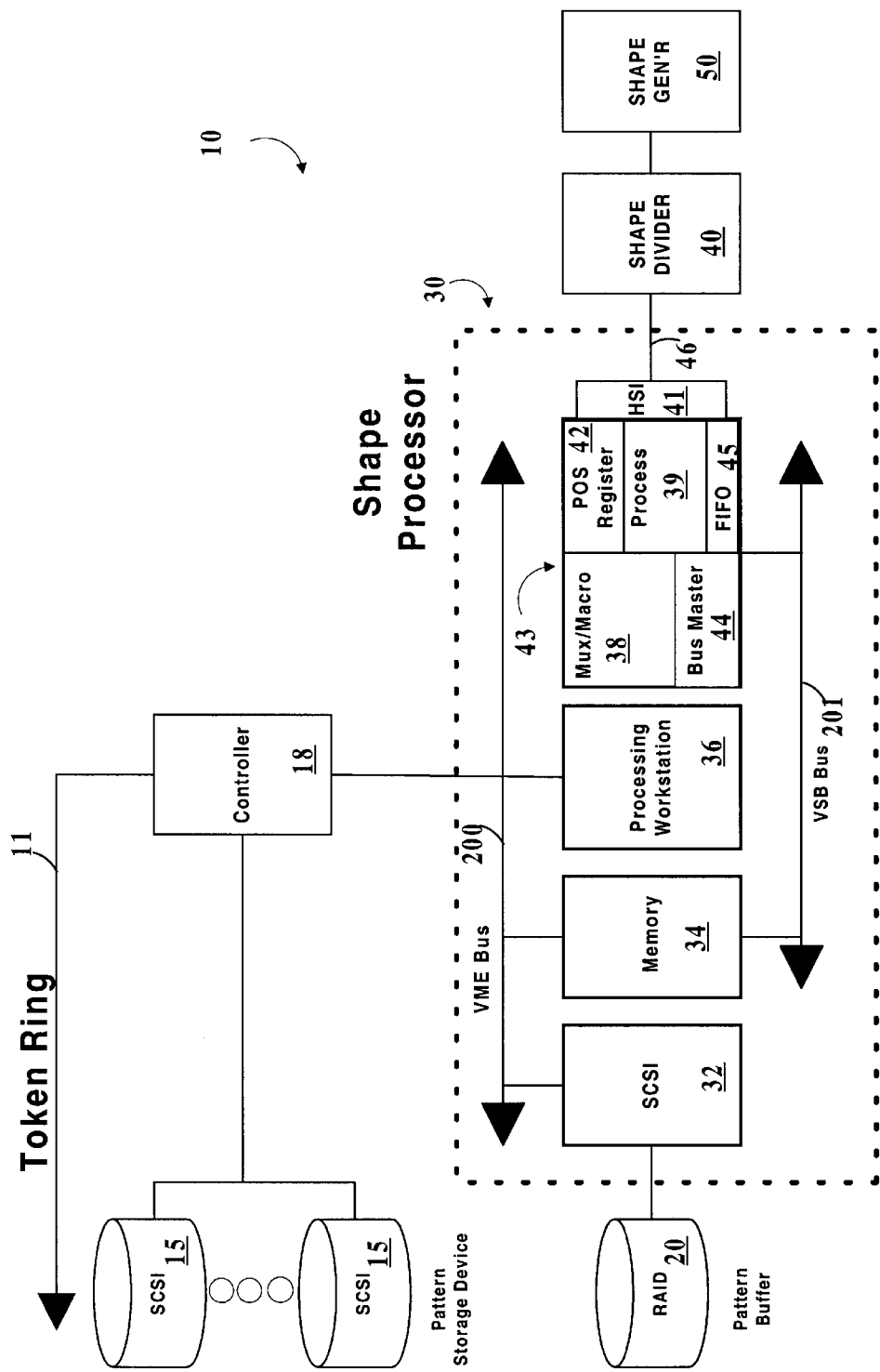
FIG. 1 is a block diagram illustrating the pattern data processing system in accordance with a preferred embodiment of the present invention.

With reference to FIG. 1, a block diagram of a preferred embodiment of the pattern processing system 10 of the present invention is shown. The pattern processing system 10 comprises pattern storage device 15, computer Controller 18, Shape Processor 30, RAID Pattern Buffer 20, Shape Divider 40 and Shape Generator 50. Controller 18, coupled to Token Ring 11, pattern storage device 15, and Shape Processor 30, receives commands from Tool Controller 72 (FIG. 2) via Token Ring 11 and pattern data from pattern storage device 15, respectively. Controller 18 then inputs the data and corresponding commands to Shape Processor 30. Pattern Buffer 20, coupled to Shape Processor 30, temporarily stores the pattern data until the pattern data is needed for processing by the Shape Processor 30. The Shape Processor 30 then processes the pattern data and outputs the processed data to Shape Generator 50 via Shape Divider 40. Disclosed hereafter are preferred devices and capabilities thereof for use in the pattern processing system 10. One skilled in the art will understand that other devices having different capabilities can be used herein provided those other devices perform the function required by the pattern processing system 10.

One particular implementation of pattern storage device 15 is a 70 GigaByte (GB) Pattern Library that uses standard Small Computer System Interface (SCSI) disks for storing and supplying pattern data. As aforementioned, the pattern storage device 15 is coupled to Controller 18. The preferred embodiment of Controller 18 is an IBM RISC System 6000 (RS/6000) Model R20 computer running under the IBM AIX operating system. Controller 18 is responsible for hosting pattern storage device 15 as well as loading patterns into Shape Processor 30 to be exposed on circuit bases (not shown).

Pattern Buffer 20 is preferably a 16 GB RAID pattern memory buffer 20. The Pattern Buffer 20 receives and temporarily holds the selected pattern data from pattern storage device 15, and as aforementioned, Shape Processor 30 processes and decodes the pattern data. A RAID pattern memory buffer is used in place of a typical RAM buffer because it provides large, inexpensive, and space-saving data storage. Furthermore, it easily recovers from a disk failure.

Shape Processor 30 is preferably a Versa Module Eurocard/Versa Module Eurocard Subsystem Bus (VME/VSB) 200/201 bus-based unit comprising a fast/wide SCSI card 32; a 32 MB VME/VSB dual-port Memory 34; and a PowerPC processing workstation 36, coupled to Memory 34 and SCSI card 32 through VME bus 200. Shape Processor 30 also comprises a field-programmable gate array (FPGA) device 43 including Multiplexing/Macrotizing (Mux/Macro) and Process portions 38 and 39, First-In First-Out (FIFO) buffers 45, VSB Bus Master 44, and Previous Output Shape (POS) register 42. The FIFO buffers 45 include Macro and Dosemerge FIFO buffers. FPGA device 43 is connected to Memory 34 through VSB bus 201. Extending from the FPGA device 43 is a High Speed Interface (HSI) 41, which regulates the transfer of pattern data through a wide parallel bus 46 connecting FPGA device 43 to Shape Divider 40 and Shape Generator 50.

Processing workstation (PW) 36 controls the transfer of pattern data from Pattern Buffer 20 to Memory 34 and FPGA device 43 and is discussed in greater detail below. Memory 34 comprise read and write buffers, which allow multiple buffering to occur during pattern data transfer.

FPGA device 43 of Shape Processor 30 decodes different pattern data formats by dynamically reconfiguring the different formats with different decoding schemes. That is, a plurality of formats may be used to code the pattern data. All the pattern data, regardless of its format, is loaded onto the FPGA device 43. Through a plurality of decoding schemes, comprising the use of commands and flags as discussed in greater detail below, this pattern data may be decoded dynamically, that is, without reloading or interrupting the job in process. A job is defined by the complete processing of all the loaded pattern data. This "on-the-fly" reconfiguration allows for high speed processing within the same job without user intervention.

High speed processing is also achieved through the intelligent VSB Bus Master 44, which allows for independent DMA operation by Bus Master 44 on VSB bus 201. This feature is important as it frees the Central Processing Unit (CPU) of the Processing Workstation 36 for other operations during pattern processing. During pattern write, data is written and read from the single Memory 34. Since there is only one internal bus within Memory 34 to service both ports, a VME memory write might be postponed until a VSB memory read has been completed or vice versa. A typical VSB bus master would need to start its processing over again after such an interruption if the CPU is not available to reload a new address and byte count. In comparison, Bus Master 44 of the present invention may be interrupted during the data transfer, and, after the interruption is over, can resume where it last left off without any CPU intervention (i.e., it will not need to be restarted).

The POS Register 42 uses information from previous shapes to decompress new shapes. Thus, the elements of pattern data that are repeated or similar in shape to the prior elements of an original pattern data need not be stored, only the elements that vary between the present pattern data and the original pattern data. A macro is a section of the pattern that is repeated multiple times with differences only in absolute placement and exposure dose, as discussed herein more thoroughly below with FIGS. 8, 10 and 11. Thus, pattern data is stored in variable lengths and decompressed by referencing its elements to the previous pattern data elements. This increases compression efficiency. Also, since the macro data for the patterns is only loaded once per map, which could be a map for a part of a shape or a multitude of shapes, disk space is conserved.

Figure 2:
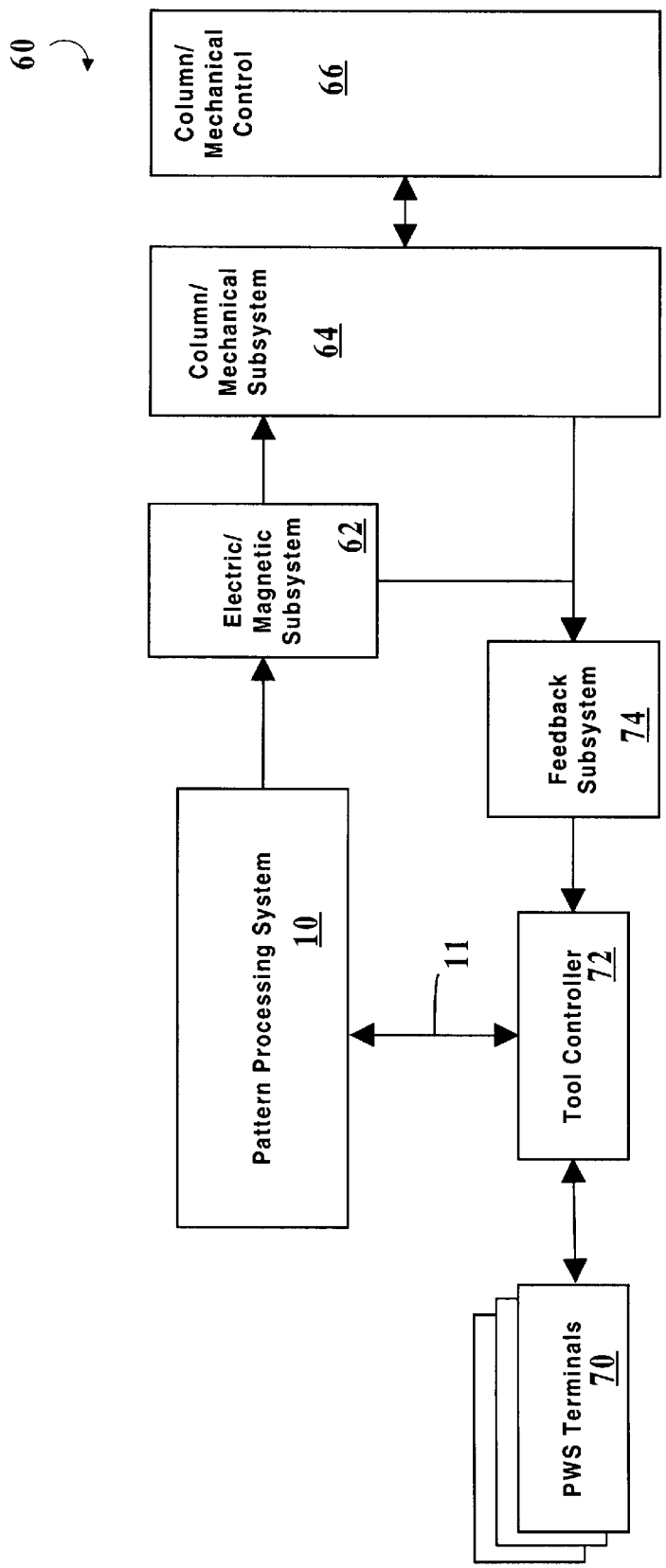
FIG. 2 is a block diagram illustrating the pattern processing system of FIG. 1, used within a lithography system in accordance with a preferred embodiment of the present invention.

As shown in FIG. 2, the pattern processing system 10 is part of a multi-component lithography datapath system 60. In addition to the pattern processing system 10, the lithography system 60 further comprises Electric/Magnetic Subsystem 62, Column/Mechanical Subsystem 64, Column/Mechanical Control 66, Feedback Subsystem 74, Tool Controller 72 and Programmable Work Station (PWS) terminals 70. The pattern processing system 10 is coupled to Tool Controller 72 and receives and issues commands therefrom. The pattern processing system 10 is also coupled to Electric/Magnetic Subsystem 62, which in turn is coupled to Column/Mechanical Subsystem 64. Control is provided to Column/Mechanical Subsystem 64 through Column/Mechanical Control 66. Feedback Subsystem receives the outputs of both Electric/Magnetic Subsystem 62 and Column/Mechanical Subsystem 64. The output of Feedback System 74 is then inputted into Tool Controller 72, wherewith Tool Controller 72 communicates with the PWS terminals 70 and Controller 18 (FIG. 1) of the pattern processing system 10.

The processed pattern data of the pattern processing system 10 provides the necessary data for the lithography system 60 to generate the corresponding shape on an integrated circuit base (not shown). Through the data received therefrom, Electric/Magnetic and Column/Mechanical Subsystems 62 and 64, respectively, control the spot size, the exposure (dose) value, electron beam position, etc. Feedback Subsystem 74 processes and relays the results of the actual beam position from subsystems 62 and 64 to Tool Controller 72. Tool Controller 72 then sends the necessary commands to pattern processing system 10 for necessary corrections as indicated by Feedback Subsystem 74 or the PWS Terminals 70. Thereby an accurate shape may be generated on the circuit base.

FIGS. 3–11 describe the process for loading and writing the pattern data for storage and manipulation by the pattern processing system 10 (FIG. 1). As illustrated in FIG. 1, in the first operation, Pattern Load, pattern data is copied from the pattern storage system 15 to the RAID Pattern Buffer 20. In the second operation, Pattern Write, the pattern data is transferred from the RAID Pattern Buffer 20 to Memory 34 by PW 36 and then read and processed by the FPGA device 43.

Figure 3:
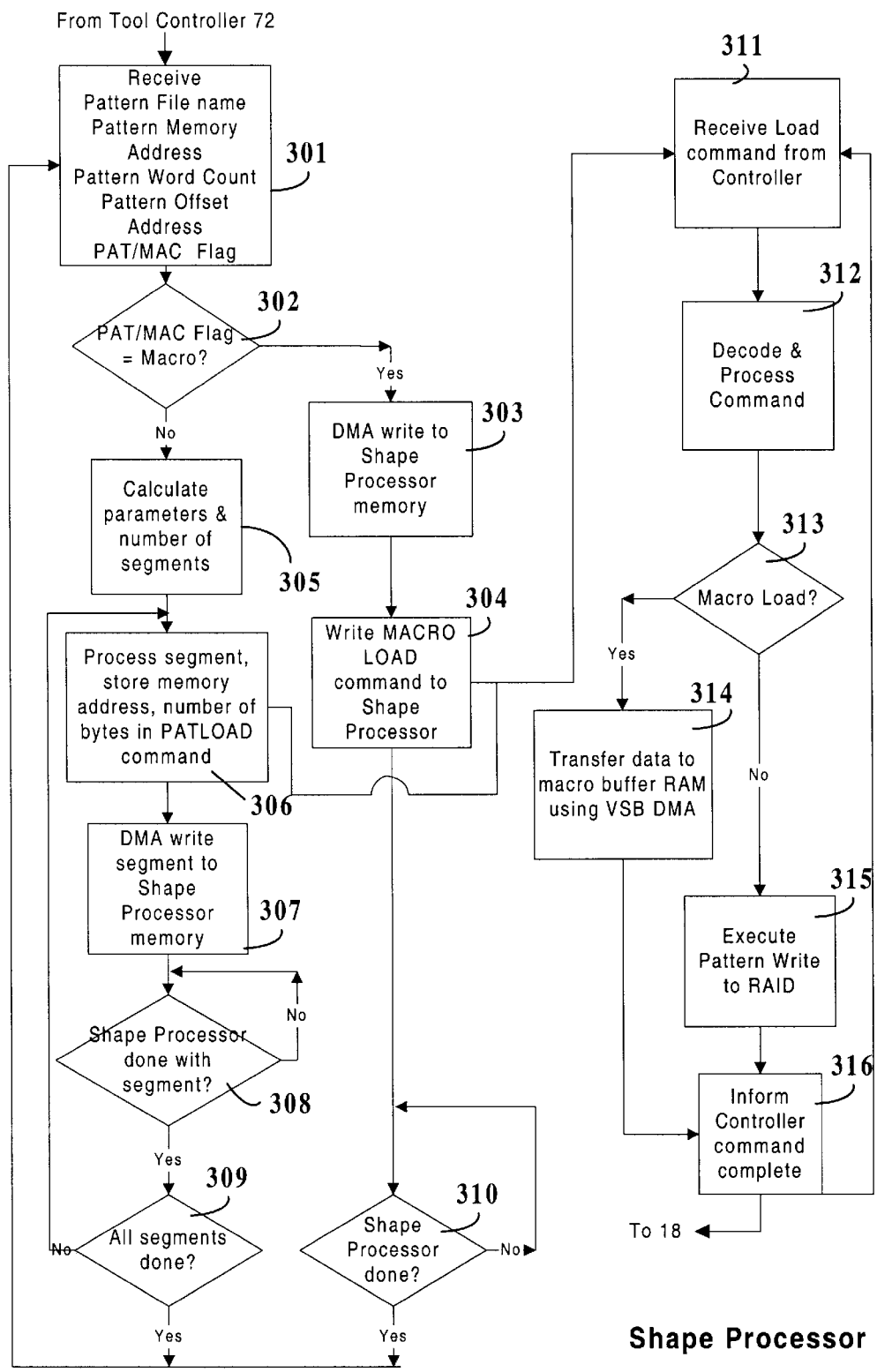
FIG. 3 is a flow diagram of the pattern load function between the Controller and the Shape Processor of FIG. 1.

As illustrated in FIG. 3, the Pattern Load operation is depicted in a flowchart for both Controller 18 and the Shape Processor 30 (FIG. 1). The components as opposed to the steps are referred to FIGS. 1 and 2. Controller 18 will receive a pattern file name, pattern memory address, pattern word count, pattern offset address and pattern/macro (PAT/MAC) flag (step 301) from Tool Controller 72. If the flag indicates macro data (step 302=yes), Controller 18 will load the macro data to Memory 34 (step 303). Controller 18 will then communicate the Macro Load command to PW 36 within the Shape Processor 30 (step 304). PW 36 receives the command (step 311), decodes it (step 312), then loads the macro data to the Shape Processor macro buffers 45 (step 313=yes, step 314). The macro data is transferred to the macro buffers 45 using VSB Bus Master 44. When the transfer is complete, the Controller 18 is informed (step 316, step 310=yes).

If the flag in the Controller 18 indicates other than macro data (step 302=no), the data is pattern data. The magnitude of this data is usually large. Thus it is divided and loaded to the Shape Processor 30 in segments (steps 305–309). Controller 18 first calculates the parameters and number of segments (step 305). Then, for each data segment Controller 18 processes the segment, stores memory address and places the number of bytes in the Pattern Load (PATLOAD) command (step 306). The pattern data of the segment is loaded to Memory 34 in the Shape Processor 30 (step 307). Controller 18 then communicates the Pattern Load command to the Shape Processor PW 36. The segments are processed and loaded into Memory 34 (step 309=no) until all segments are loaded (step 309=yes). PW 36 of the Shape Processor 30 will receive (step 311) and decode (step 312) the command. PW 36 will then load the pattern data to the RAID Pattern Buffer 20 (step 313=no, step 315). The Shape Processor 30 informs the Controller 18 when the Shape Processor 30 is done (step 316, step 308=yes).

The second operation, which is performed after the Pattern Load operation, is the Pattern Write operation. Referring to FIGS. 1 and 2, commands are sent from Tool Controller 72 to Controller 18, decoded, and passed to PW 36 in the Shape Processor 10. PW 36 coordinates the reading of pattern data from the RAID Pattern Buffer 20 via the SCSI 32, buffering data in Memory 34, and passing addresses of the data to the Mux/Macro portion 38 of FPGA device 43. The FPGA device 43, which contains the VSB Master 44, fetches the pattern data from Memory 34. FPGA device 43 converts the pattern data from variable-length pattern and macro data commands into a series of fixed-length commands. These are sent to the Shape Divider 40 and Shape Generator 50.

Figure 4:
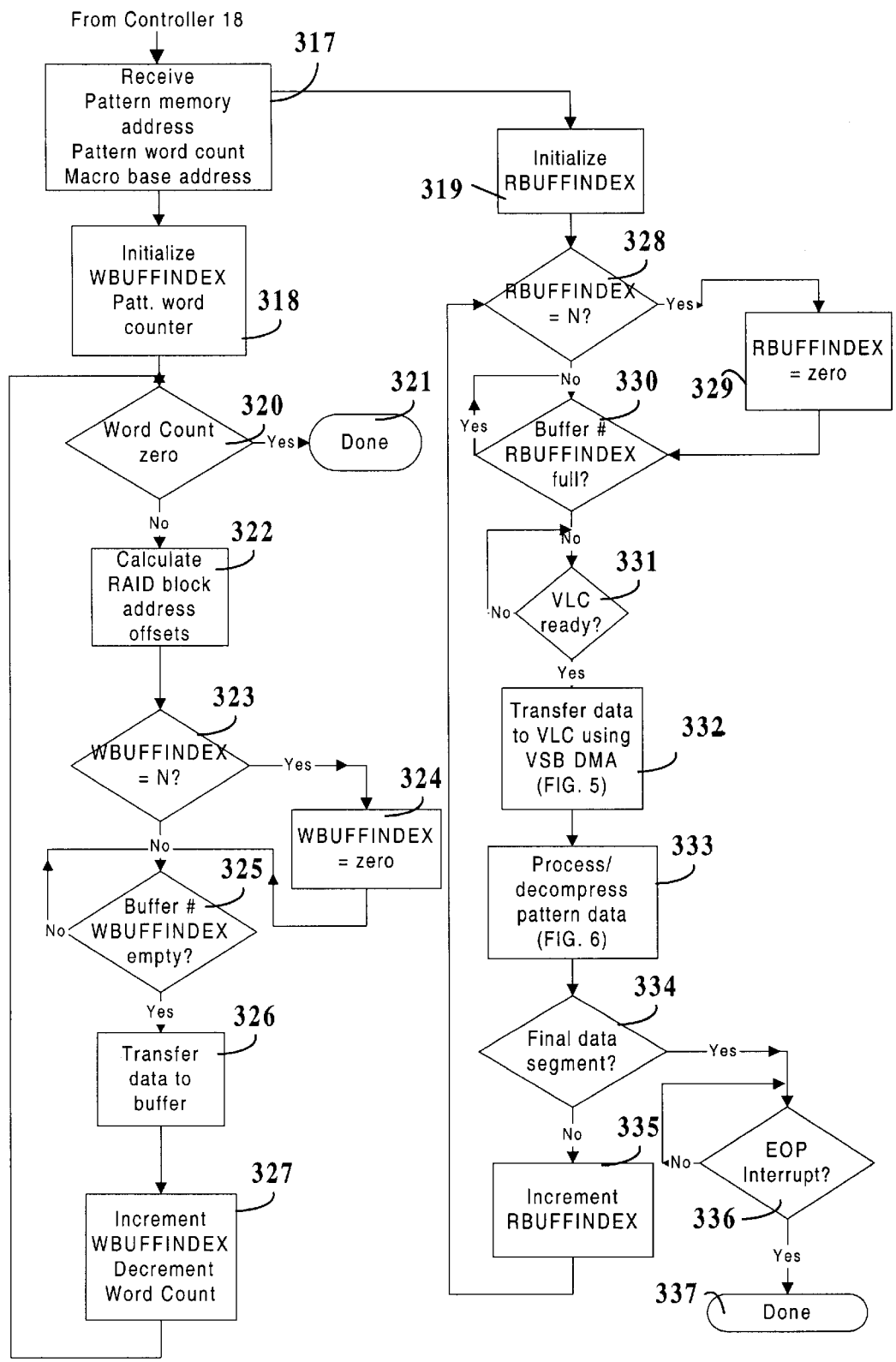
FIG. 4 is a flow diagram of the pattern write function of the Shape Processor of FIG. 1.

FIGS. 4–11 depict in a series of flowcharts the details of the Pattern Write operation as outlined above. The components as opposed to the steps are referred to FIGS. 1 and 2. The initial pattern write function is illustrated in FIG. 4. The Processing Workstation 36 controls the pattern write operation. A pattern write command, received from the Controller 18 (step 317), initializes the Write and Read buffer indexes, WBUFFINDEX and RBUFFINDEX, respectively (steps 318 and 319). The Controller 18 contains the pattern memory address, pattern word count, and macro data memory address. The pattern memory address specifies the location of the pattern data on the RAID Pattern Buffer 20. The pattern word count specifies the pattern data size and the macro data address specifies the location of the macro data in memory.

The pattern write process utilizes a multiple buffering method. The pattern data is loaded from the RAID Pattern Buffer 20 to multiple buffers in Memory 34 (steps 320–330) until the word count is zero (step 320=yes, step 321). In writing the data from the Pattern Buffer 20, the RAID block address offsets are calculated (step 322). If WBUFFINDEX does not equals a number N (step 323=no), and if the buffer is empty (step 325=yes), the data is transferred to the buffer (step 326). WBUFFINDEX is incremented and the word count is decremented (step 327) and the process starts over again. If WBUFFINDEX equals N (step 323=yes), then the indexed is zeroed out (step 324). As soon as the first data buffer is filled by the PW 36 (step 330=no), the intelligent VSB Bus Master 44 transfers the data to the FPGA Variable Length Command (VLC) processing stage (FIG. 6) (step 331=yes, steps 332 and 333). Since VSB Master requires no CPU intervention, pattern data can be loaded (step 332) and processed (step 333) simultaneously provided the read and write buffers are different (step 328=no and step 323=no). Processing continues until the word counter equals zero (step 320) indicating all data has been processed (step 321). Processing also stops when the data is on its final data segment (step 334=yes), followed by an EOP interrupt (step 336=yes.

Figure 5:
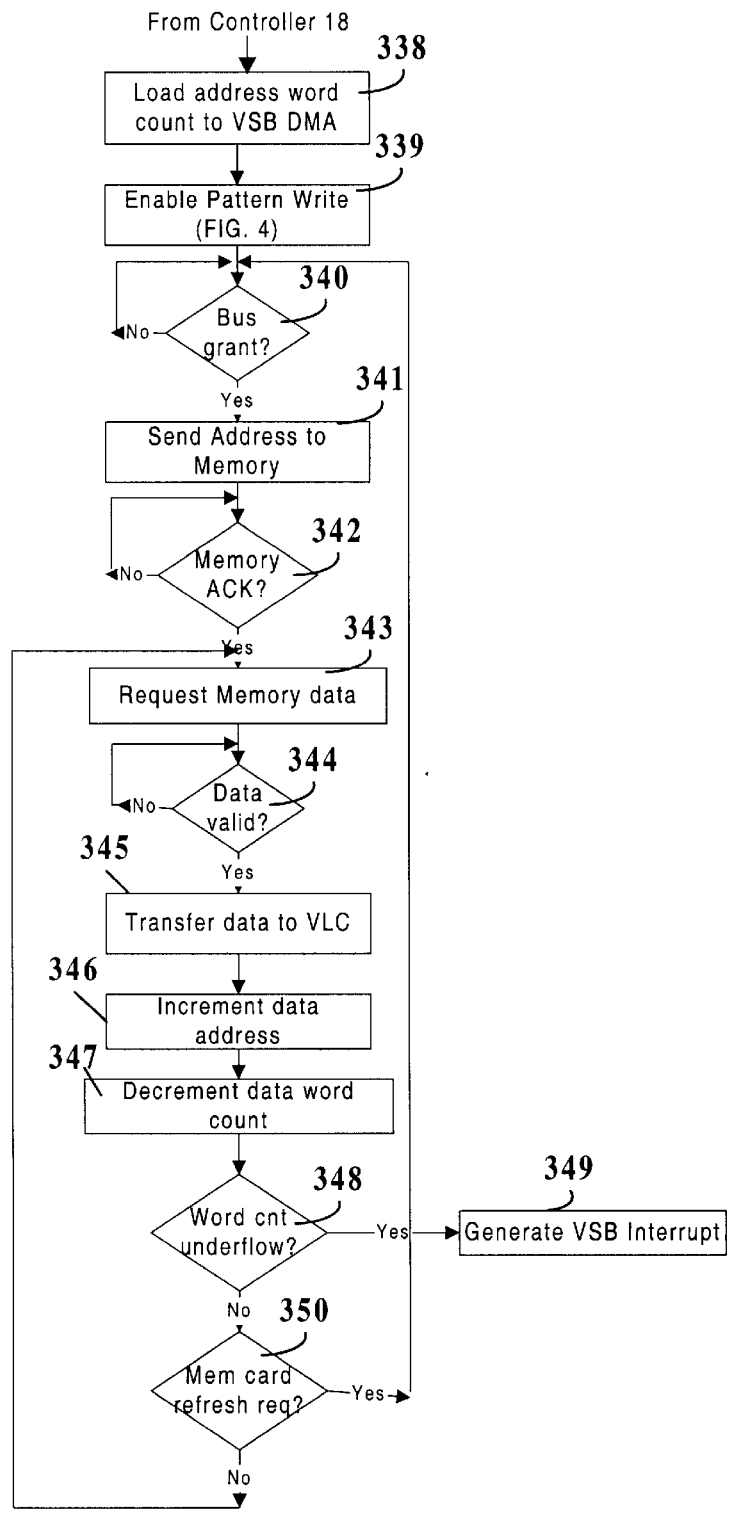
FIG. 5 is a flow diagram of the direct memory access (DMA) master operation used in conjunction with FIG. 4.

FIG. 5 depicts the VSB DMA transfer that occurs during pattern write (FIG. 4). The address word count is loaded to the VSB Bus Master 44 (steps 338), and pattern write is enabled (step 339). After VSB bus arbitration (step 340=yes), the address is sent to the Memory (step 341) and is followed by the Memory 34 acknowledgment (step 342). Data is then read from the Memory 34 (step 343) and written to the VLC (step 345) when the data is valid (step 344=yes). The data address is incremented (step 346) and the word count is decremented (step 347). If the transfer is interrupted as in a memory card refresh (step 348=no, step 350=yes), the transfer restarts with a new address and word count based upon where it left off (step 340). Otherwise the data continues to be loaded from Memory (step 350=no, step 343). If an underflow occurs with the word count (step 348=yes), a VSB interrupt is generated (step 349) to stop the process. Data transfer continues until the word count equals zero (step 320 of FIG. 4).

Figure 6:
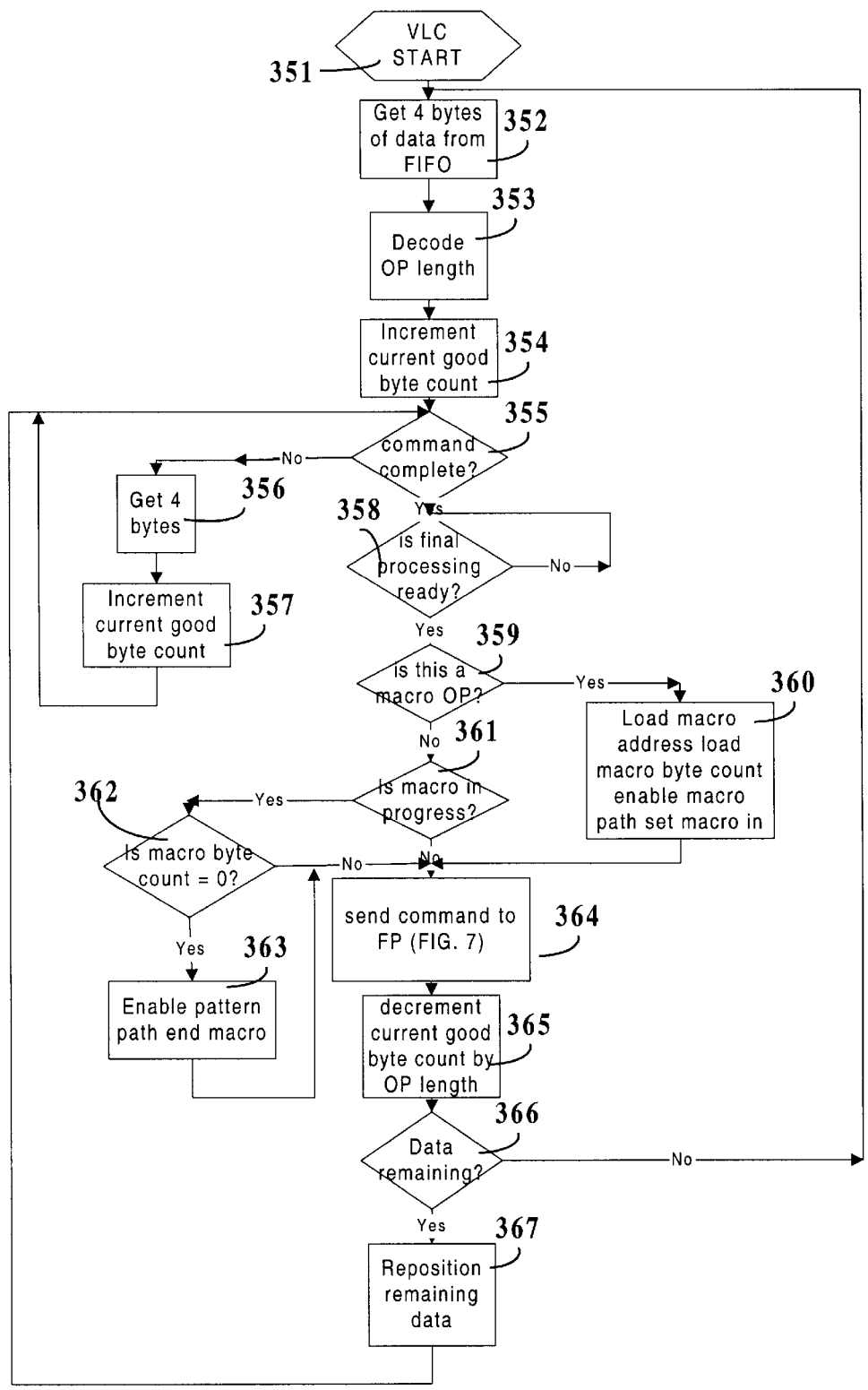
FIG. 6 is a flow diagram of the Variable Length Command Processing of the pattern write function of FIG. 4.

FIG. 6 provides a high level description of the pattern VLC processing stages occurring during pattern write (step 351). Pattern data, read from the Memory 34 into the FIFO 45 (step 352), is decoded for OP length, that is the length of the command (step 353). A byte counter is incremented (step 354) and data is read from the FIFO 45 (steps 356 and 357) until a complete command has been collected (step 355=yes). If the Final Processing (FP) stage is ready to receive data (step 358=yes), then the command is checked if it is a macro (step 359). If it is a macro (step 359=yes), then the macro address in Memory 34 and macro byte count are stored (step 360). The macro data is then sent to the FP stage (FIG. 7) (step 364) and the macro byte counter decremented (step 365) until it equals zero indicating macro processing complete (step 366=no). No additional commands are read in from the FIFO 45 until macro processing is complete (step 361=no). If the macro is in progress (step 361=yes), and the macro byte count is zero (step 362=yes) then the pattern path end macro is enabled (step 363). If the command is not a macro (step 359=no, step 361=no) it is then sent directly to the FP stage for decoding (step 364). The remaining data is repositioned (step 367) and the sequence continues (step 355) until all pattern data has been processed.

Figure 7:
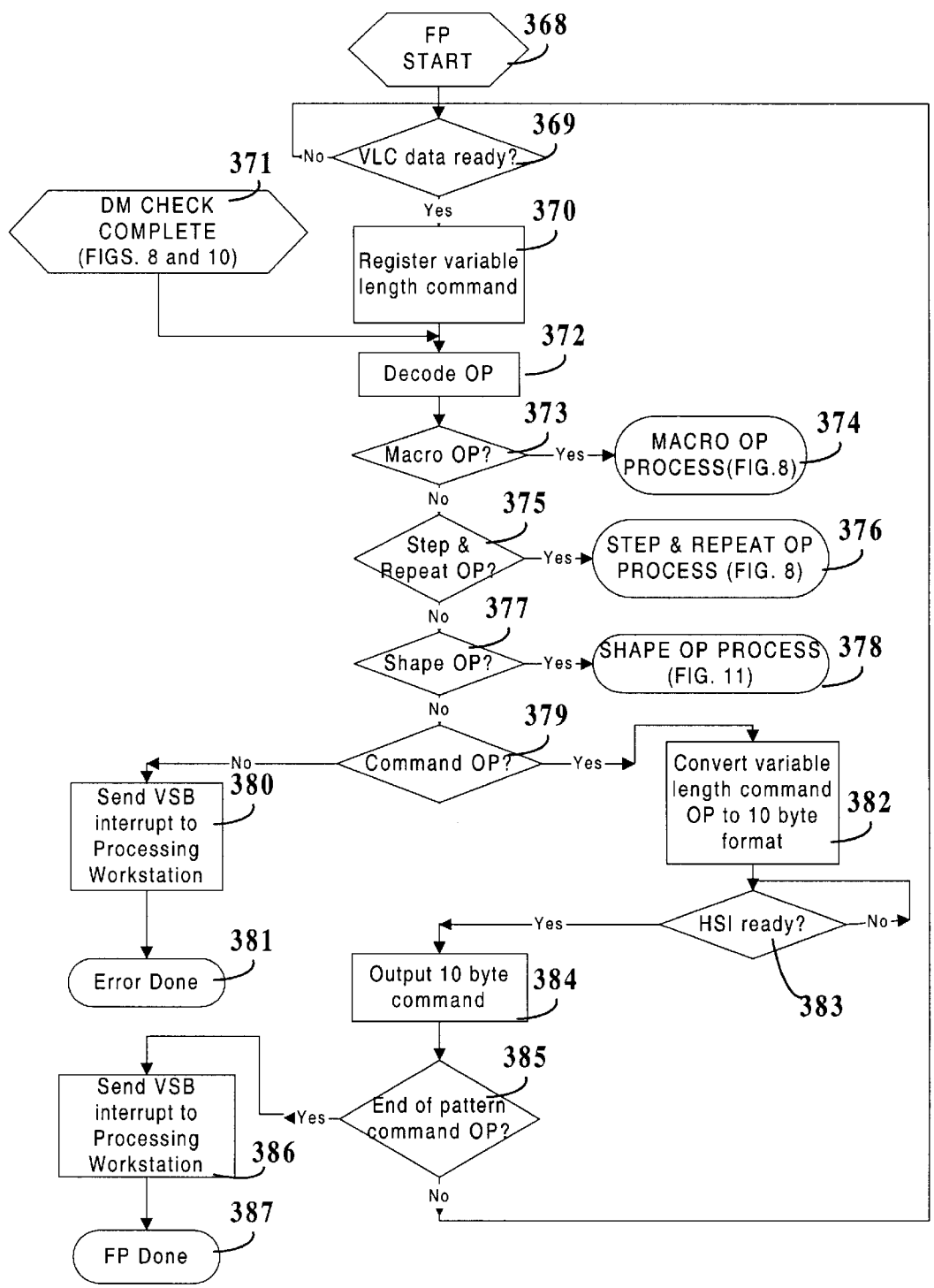
FIG. 7 is a flow diagram of the final processing of the Variable Length Command of FIG. 6.

FIG. 7 depicts a high level description of the FP stage sequence (step 368). The FP stage first waits until there is data present to be processed (step 369=yes). Then the VLC is stored (step 370) and, decoded (step 372) either with the input of the FP stage (step 368) or with the input of the Dosemerge (DM) Check Complete (step 371, from FIGS. 8 and 10). The command is then processed based upon the decode: Macro OP (FIG. 8) (step 373=yes, step 374), Step & Repeat OP (FIG. 8) (step 375=yes, step 376), Shape OP (FIG. 11) (step 377=yes, step 378), or Command OP (step 379=yes). If it is a Command OP, it is then converted to 10 bytes (step 382) and sent out through the HSI (step 383=yes, step 384). If the command is not a Command OP (step 379=no), then a VSB interrupt is sent to PW 36 (step 380) to indicate an error (step 381). All commands are processed until an End of Pattern (EOP) command is received indicated processing complete (step 385=yes, steps 386 and 387).

Figure 8:
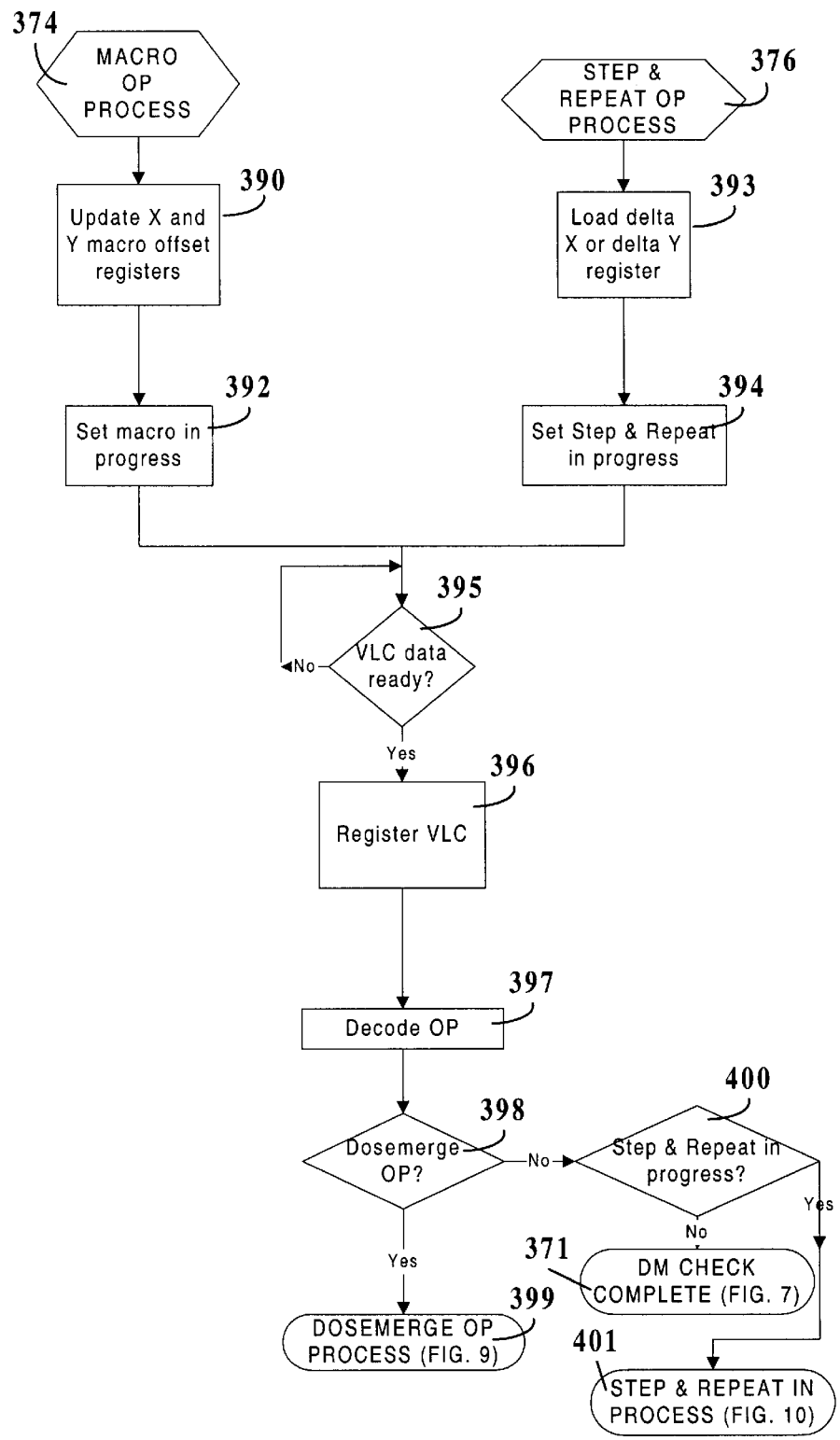
FIG. 8 is a flowchart of the processing of the Macro and Step & Repeat OP commands of FIG. 7.

FIG. 8 illustrates the Macro (step 374) and Step & Repeat OP (step 376) processing. As aforementioned, a macro is a section of the pattern that is repeated multiple times with differences only in absolute placement and exposure dose. The macro OP contains the information fields for where to read the data (including the macro offset registers), the placement, and the amount of the data. If there are different doses required for the macro shapes, then the command following the macro will be a Dosemerge. The Dosemerge OP is followed by a sequence of exposure doses for the aforementioned Macro.

A Step & Repeat OP utilizes the previous shape data, stored in the POS register as reference for the next shape. The OP contains the information fields for step changes in X/Y placement (delta X/Y values), and the number of steps to take. This command can also be followed by a Dosemerge OP if different doses are required other than the dose stored in the POS register.

Figure 9:
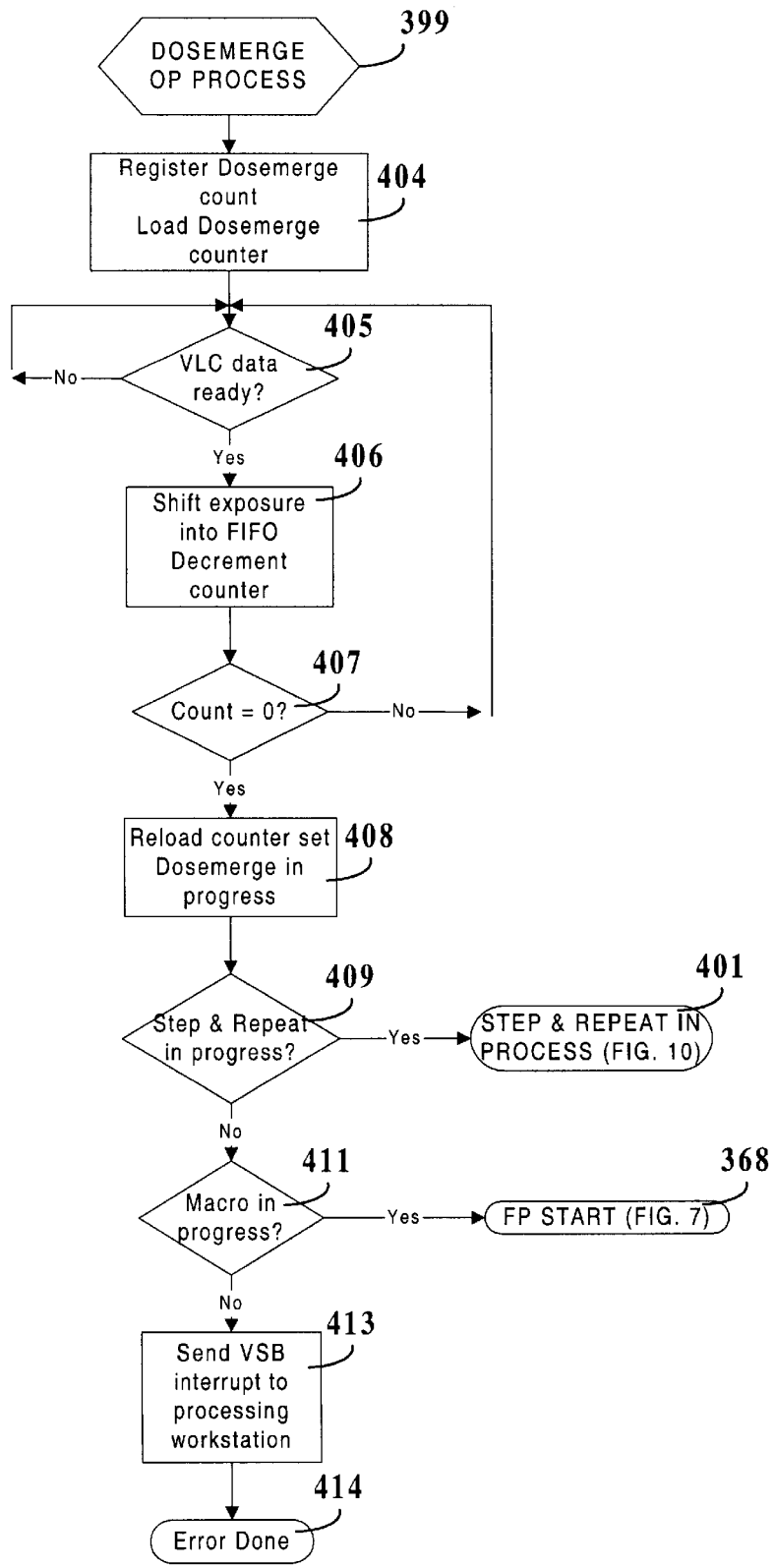
FIG. 9 is a flowchart of the processing of the Dosemerge OP command of FIG. 7.
Figure 10:
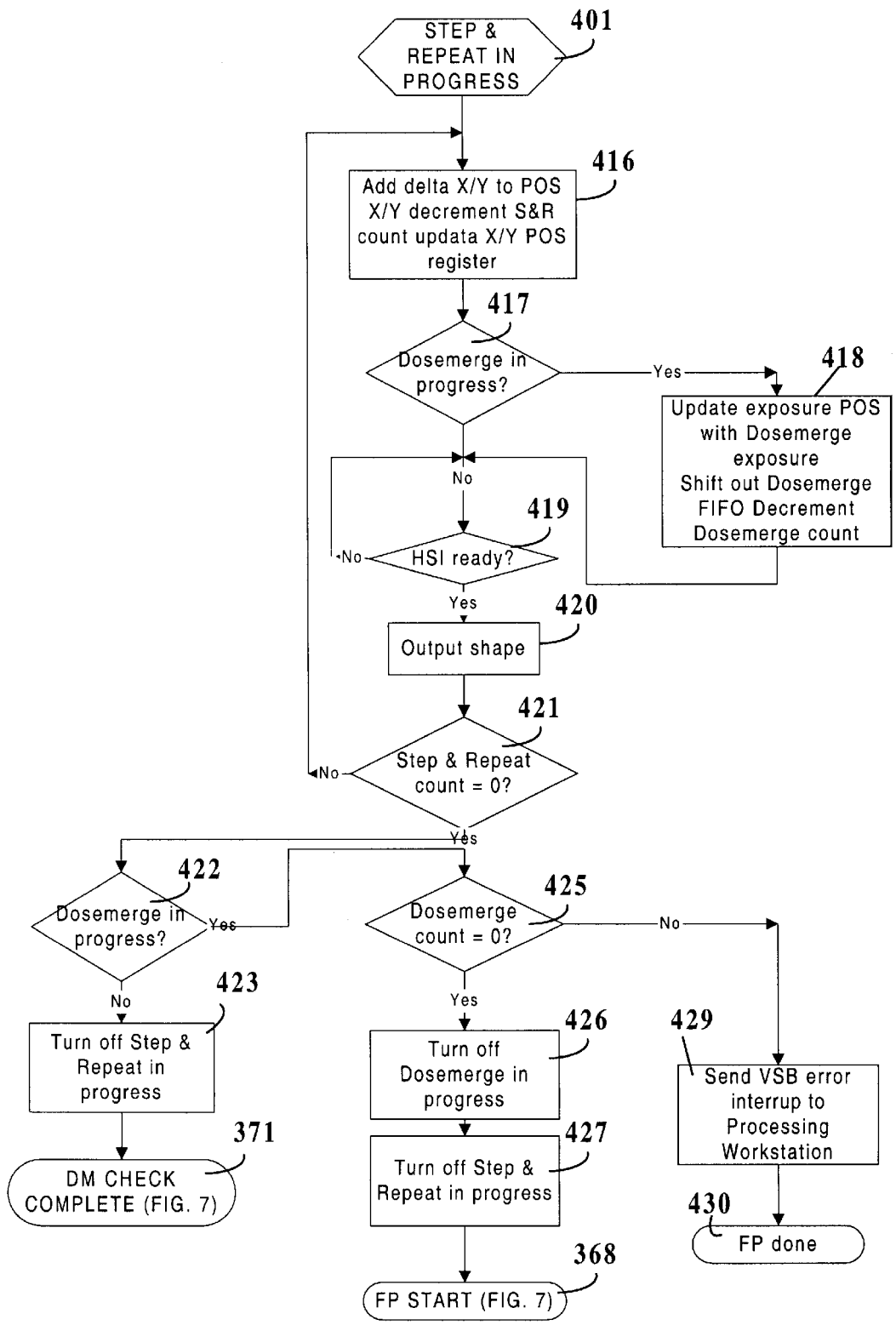
FIG. 10 is a flowchart of the Step & Repeat in process of FIGS. 8 and 9.

The flow chart of FIG. 8 describes the initial processing of the Macro and Step & Repeat OPs (steps 374 and 376, respectively) as originated from FIG. 7. If the command is decoded as a Macro OP (step 374), then the X & Y macro offset registers are updated (step 390) and the macro process flag is set (step 392). If the command is decoded as a Step & Repeat OP (step 376), then the delta X or Y value registers are loaded (step 393) and the Step & Repeat process flag is set (step 394). After step 392 or 394, the next OP is read in from the VLC (step 395=yes, step 396) and decoded (step 397). If it is decoded as a Dosemerge OP (step 398=yes), then processing continues as depicted in FIG. 9 (step 399). If it is not a Dosemerge OP (step 398=no) and the Step & Repeat flag is active (step 400=yes), then processing continues as depicted in FIG. 10 (step 401). If the Step & Repeat flag is not active (step 400=no), then a macro is in progress and the final processing continues (step 371 of FIG. 7).

If the Macro OP (step 374) or Step & Repeat OP (step 376) from FIG. 8 has been decoded as a Dosemerge (step 398=no, step 399), the command is then processed as described in FIG. 9. The Dosemerge count is read into a counter (step 404) and the VLC is checked for available data (step 405=yes). This data will be a sequence of new doses equal in number to the Dosemerge count. The data is read into a FIFO 45 (step 406) and the counter decremented (step 407=no, steps 405 and 406) until all data has been read (step 407=yes). At this point the counter is reset with the Dosemerge count (step 408) and the Step & Repeat processing flag (step 409) is checked. If active (step 409=yes), then processing continues as described in FIG. 10 (step 401). Otherwise the Macro flag is checked (step 409=no, step 411) and if active (step 411=yes), processing continues as described in FIG. 7 (step 368). If both the Step and Repeat flag and the Macro flag is inactive (step 409=no, step 411=no), an error has occurred and an interrupt is sent to PW 36 (steps 413 and 414).

FIG. 10 describes in detail the processing that occurs during a Step & Repeat when the outputs of FIGS. 8 and 9 indicate a Step & Repeat in Progress (step 401). First, the delta X/Y values are added to the values in the POS register and the Step & Repeat counter is decremented (step 416). Then the Dosemerge flag is checked (step 417) and if active (step 417=yes) a new exposure value is read from the Dosemerge FIFO 45 and the Dosemerge counter is decremented (step 418). The data is then combined and a Shape command constructed and outputted through the HSI (step 419=yes, step 420). If the Dosemerge flag is inactive (step 417=no) the data is outputted directly. If the Step & Repeat count is not zero (step 421=no), the delta values are again added to the POS values (step 416) and the sequence repeats until the Step & Repeat count is zero (step 421=yes). At this point the Dosemerge flag is checked (step 422). If active (step 422=yes), the Dosemerge count is checked (step 425) and if zero (step 425=yes), The Dosemerge and Step & Repeat flags are zeroed (steps 426 and 427). Processing then continues as in FIG. 7 (step 368). If the Dosemerge flag is not active (step 422=no) then the Step & Repeat flag is zeroed (step 423) and processing continues as in FIG. 7 (step 371).

Figure 11:
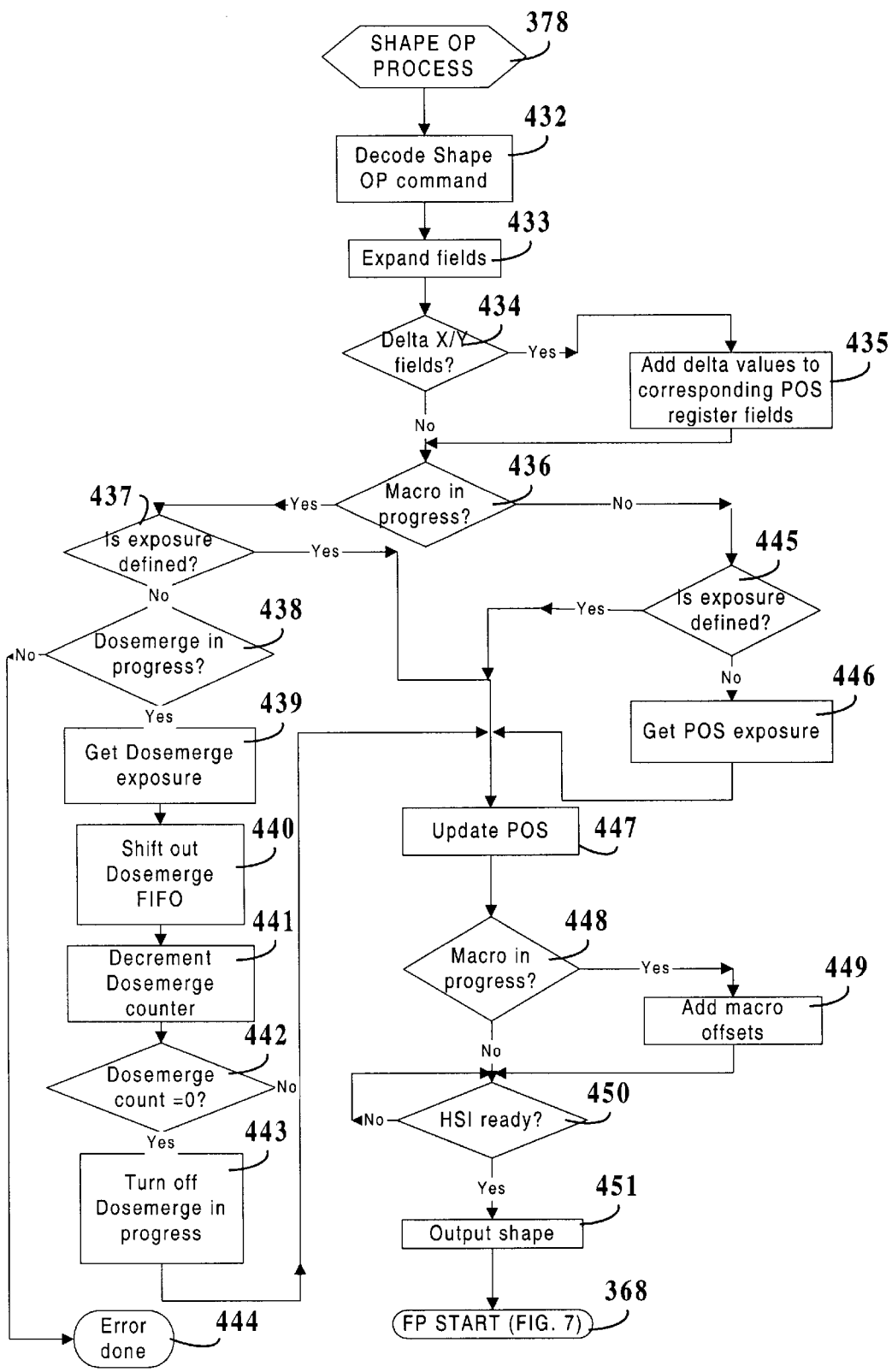
FIG. 11 is a flowchart of the final processing of the Shape OP command of FIG. 7.

The Shape OP contains the information for where to place the shape, the shape dimensions, and the shape exposure. FIG. 11 illustrates the processing that occurs after a Shape OP is decoded from FIG. 7 (step 378). The OP is decoded (step 432), expanded (step 433), and if the fields of the OP contains delta values (step 434=yes), the values are added to the corresponding POS register fields (step 435). If the Macro flag is active (step 436=yes), the exposure value undefined (step 437=no), and the Dosemerge is in progress (step 438=yes) then the exposure is read from the Dosemerge FIFO 45 (steps 439–440). The Dosemerge counter is decremented (step 441) and when the Dosemerge count is zero (step 442=yes) the Dosemerge in progress flag is turned off (step 443). If the Dosemerge is not in progress (step 438=no) an error is indicated (step 444). If the Macro flag is not active (step 436=no) and the exposure undefined (step 445=no), then the exposure value is obtained from the POS register (step 446). Otherwise the exposure value is contained within the Shape OP. Next the POS is updated with the latest data (step 447) and Macro flag is checked (step 448). If active (step 448=yes), the macro offsets are added to the shape position (step 449). The new shape is then sent out through the HSI (step 450=yes, step 451) and the OP processing continues as described in FIG. 7 (step 368).

Thus, this invention discloses a pattern processing system (FIG. 1) that efficiently and inexpensively stores and processes pattern data, and processes that data in such a way to save memory space and CPU intervention.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A pattern data processing system, comprising:
   a pattern storage device for storing pattern data and configuration data, said pattern data having a plurality of encoding schemes and said configuration data having a plurality of decoding schemes corresponding to said encoding schemes;
   a pattern memory buffer, coupled to said pattern storage device, for receiving and holding said pattern data from said pattern storage device;
   a dynamically reconfigurable programmable array device, coupled to said pattern memory buffer, for dynamically decoding said pattern data having a plurality of encoding schemes with said plurality of decoding schemes, wherein said configuration data reconfigures said dynamically reconfigurable programmable array device; and
   a shape generator, coupled to said dynamically reconfigurable programmable array device, for generating a shape from said decoded pattern data.

2. The system of claim 1, wherein said pattern memory buffer is a Redundant Array of Independent Disks (RAID) memory buffer.

3. The system of claim 1, wherein said dynamically reconfigurable programmable array device further comprises:
   a register for referencing a present shape pattern data element to a prior shape pattern data element, wherein said pattern memory buffer stores only the variation between said present shape pattern data element and said prior shape pattern data element.

4. The system of claim 3, wherein said register is a Previous Output Shape (POS) register.

5. The system of claim 1, wherein said dynamically reconfigurable programmable array device further comprises: a direct memory access (DMA) bus master for providing DMA operations independent of a processor from said pattern data processing system.

6. The system of claim 5, wherein said DMA bus master is a Versa Module Eurocard Subsystem Bus (VSB) DMA bus master.

7. A method for generating a pattern with a pattern data processing system comprising the steps of:
   a) storing pattern data and configuration data into a memory buffer, said pattern data having a first and a second encoding scheme and said configuration data having a plurality of decoding schemes corresponding to said encoding schemes;
   b) decoding said pattern data having said first encoding scheme with a first decoding scheme, and decoding said pattern data having said second encoding scheme with a second decoding scheme, wherein said second encoding scheme is decoded within the same job as said first encoding scheme;
   c) reconfiguring a dynamically reconfigurable programmable array device utilizing said configuration data; and
   d) generating a shape from said decoded pattern data.

8. The method of claim 7, further comprising the step of:
   referencing a present shape pattern data element to a prior shape pattern data element, wherein said memory buffer stores only the variation between said present shape pattern data element and said prior shape pattern data element.

9. The method of claim 8, wherein said referencing step uses a Previous Output Shape (POS) register.

10. The method of claim 7, further comprising the step of:
    transferring said pattern data through direct memory accessing (DMA), wherein said DMA is independent of a processor from said pattern data processing system.

11. The method of claim 10, wherein a VSB DMA bus master performs said DMA operations.

12. The method of claim 7, wherein said pattern memory buffer is a Redundant Array of Independent Disks (RAID) memory buffer.

13. A lithography system having a pattern processor subsystem, said system comprising:
    a pattern storage device for supplying pattern data and configuration data, said pattern data having a plurality of encoding schemes and said configuration data having a plurality of decoding schemes corresponding to said plurality of encoding schemes;
    a pattern memory buffer, coupled to said pattern storage device, for receiving and holding said pattern data from said pattern storage device;
    a dynamically reconfigurable programmable array device, coupled to said pattern memory buffer, for dynamically decoding said pattern data having a plurality of encoding schemes with said plurality of decoding schemes, wherein said configuration data reconfigures said dynamically reconfigurable programmable array device; and
    a shape generator, coupled to said dynamically reconfigurable programmable array device, for generating a shape from said decoded pattern data.

14. The system of claim 13, wherein said pattern memory buffer is a Redundant Array of Independent Disks (RAID) memory buffer.

15. The system of claim 13, wherein said dynamically reconfigurable programmable array device further comprises:
    a register for referencing a present shape pattern data element to a prior shape pattern data element, wherein said pattern memory buffer stores only the variation between said present shape pattern data element and said prior shape pattern data element.

16. The system of claim 15, wherein said register is a Previous Output Shape (POS) register.

17. The system of claim 13, wherein said dynamically reconfigurable programmable array device further comprises: a direct memory access (DMA) bus master for providing DMA operations independent of a processor from said pattern processor subsystem.

18. The system of claim 17, wherein said DMA bus master is a Versa Module Eurocard Subsystem Bus (VSB) DMA bus master.

* * * * *